(12) United States Patent
Cho

(10) Patent No.: US 9,640,551 B2
(45) Date of Patent: May 2, 2017

(54) PASSIVE DEVICE AND RADIO FREQUENCY MODULE FORMED ON HIGH RESISTIVITY SUBSTRATE

(71) Applicant: Dongbu Hitek Co., Ltd., Seoul (KR)

(72) Inventor: Yong Soo Cho, Daejeon (KR)

(73) Assignee: DONGBU HITEK CO., LTD., Seoul (KR)

( * ) Notice: Subject to any disclaimer, the term of this patent is extended or adjusted under 35 U.S.C. 154(b) by 0 days.

(21) Appl. No.: 15/041,576

(22) Filed: Feb. 11, 2016

(65) Prior Publication Data

US 2016/0372483 A1 Dec. 22, 2016

(30) Foreign Application Priority Data

Jun. 18, 2015 (KR) ........................ 10-2015-0086365

(51) Int. Cl.
| | |
|---|---|
| *H01L 27/12* | (2006.01) |
| *H01L 27/06* | (2006.01) |
| *H01L 49/02* | (2006.01) |
| *H01L 29/10* | (2006.01) |
| *H01L 29/06* | (2006.01) |
| *H01L 23/66* | (2006.01) |

(52) U.S. Cl.
CPC .......... *H01L 27/1203* (2013.01); *H01L 23/66* (2013.01); *H01L 27/0629* (2013.01); *H01L 28/10* (2013.01); *H01L 28/40* (2013.01); *H01L 29/0619* (2013.01); *H01L 29/0649* (2013.01); *H01L 29/1079* (2013.01)

(58) Field of Classification Search
CPC . H01L 27/1203; H01L 28/10; H01L 29/1079; H01L 29/0649; H01L 27/0629; H01L 23/66; H01L 29/0619; H01L 28/40
USPC .......................................................... 257/350
See application file for complete search history.

(56) References Cited

U.S. PATENT DOCUMENTS

| 6,956,266 | B1 * | 10/2005 | Voldman ........... H01L 21/76237 257/347 |
| 7,999,320 | B2 | 8/2011 | Botula et al. |
| 8,861,214 | B1 * | 10/2014 | Wu .......................... H01L 25/16 174/250 |
| 2009/0020811 | A1 * | 1/2009 | Voldman ............. H01L 29/0619 257/337 |

\* cited by examiner

*Primary Examiner* — Caleen Sullivan
(74) *Attorney, Agent, or Firm* — Patterson Thuente Pedersen, P.C.

(57) ABSTRACT

In embodiments, a radio frequency (RF) module includes an RF switching device, an RF active device, a passive device and a control device formed on a high resistivity substrate. The passive device can include a shallow trench device isolation region having a plate shape and formed at a surface portion of the high resistivity substrate, deep trench device isolation regions extending downward from a lower surface of the shallow trench device isolation region so as to define at least one isolated region therebetween, at least one insulating layer formed on the high resistivity substrate, and at least one passive component formed on the insulating layer.

20 Claims, 13 Drawing Sheets

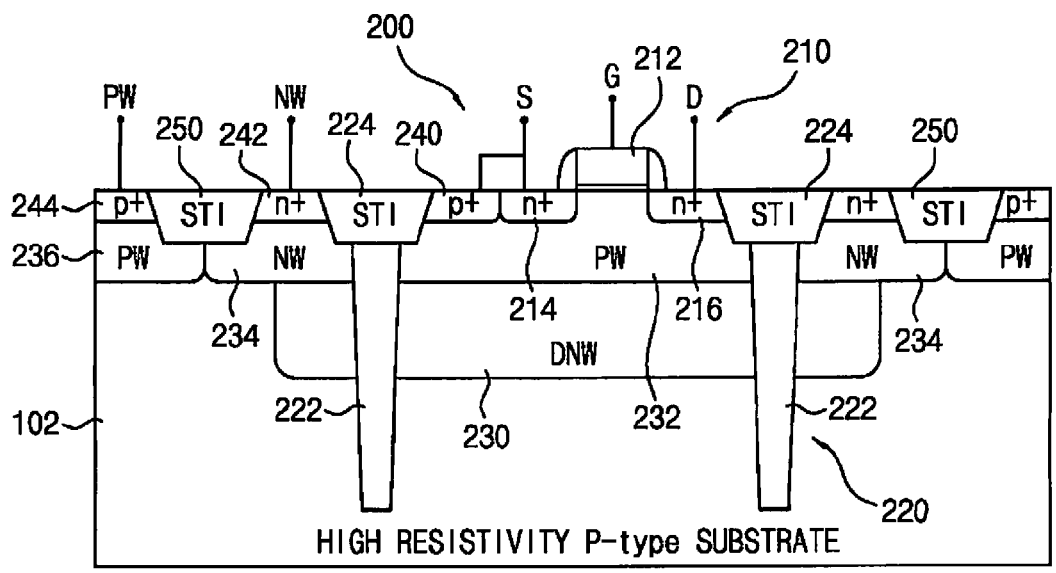
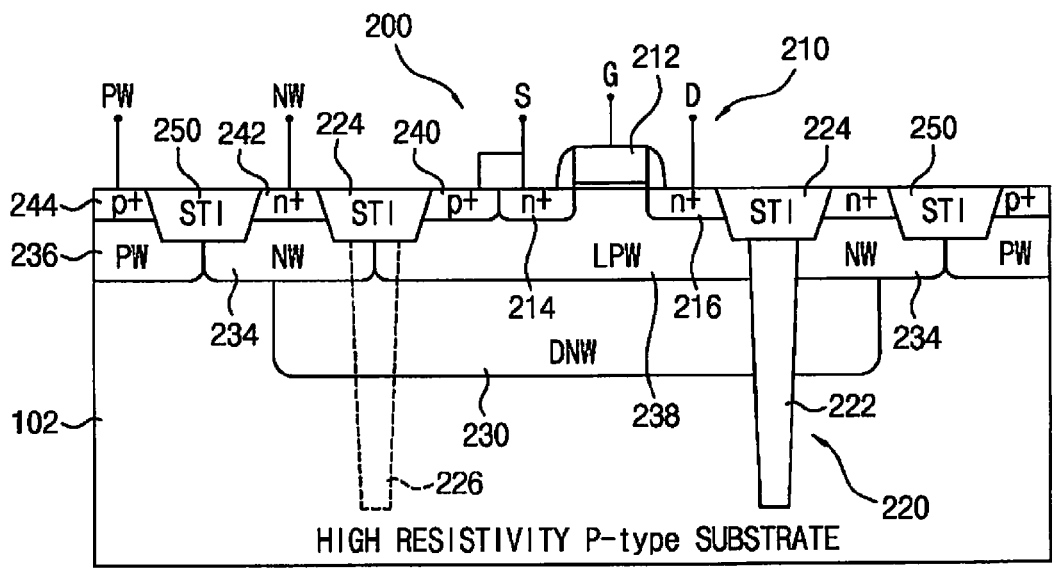

PASSIVE DEVICE AND RADIO FREQUENCY MODULE FORMED ON HIGH RESISTIVITY SUBSTRATE

CROSS-REFERENCE TO RELATED APPLICATION

This application claims priority to Korean Patent Application No. 10-2015-0086365, filed on Jun. 18, 2015 and all the benefits accruing therefrom under 35 U.S.C. §119, the contents of which are incorporated by reference in their entirety.

TECHNICAL FIELD

The present disclosure relates to a passive device and a radio frequency (RF) module formed on a high resistivity substrate, and more particularly, to a passive device formed on a high resistivity silicon substrate and an RF module including the same.

BACKGROUND

An RF module such as an RF front-end module (FEM) may be incorporated into various types of wireless devices, including mobile phones, smart phones, notebooks, tablet PC's, PDAs, electronic gaming devices, multi-media systems, and the like. The RF module may include an RF active device, a passive device, an RF switching device and a control device.

The RF switching device may be generally manufactured on a SOQ (silicon on insulator) substrate to reduce RF noise coupling, and the RF module may have a SIP/MCM (single in-line package/multi-chip module) structure including the RF switching device, the RF active device, the passive device and the control device.

However, there is a limit in reducing the manufacturing cost of the RF FEM due to the relatively high price of the SOI substrate and the cost of the SIP/MCM process.

SUMMARY

The present disclosure describes a passive device formed on a high resistivity substrate and an RF module including the same.

In accordance with an aspect of the claimed invention, a passive device may include a high resistivity substrate, a shallow trench device isolation region having a plate shape and formed at a surface portion of the high resistivity substrate, deep trench device isolation regions extending downward from a lower surface of the shallow trench device isolation region so as to define at least one isolated region therebetween, at least one insulating layer formed on the high resistivity substrate, and at least one passive component formed on the insulating layer.

In accordance with some exemplary embodiments, the passive device may further include a guard ring formed at a surface portion of the high resistivity substrate to surround the shallow trench device isolation region.

In accordance with some exemplary embodiments, the passive device may further include a noise blocking layer formed on the shallow trench device isolation region.

In accordance with some exemplary embodiments, a plurality of insulating layers may be formed on the high resistivity substrate, and a noise blocking layer may be formed among the insulating layers.

In accordance with another aspect of the claimed invention, an RF module may include an RF switching device formed on a high resistivity substrate, an RF active device formed on the high resistivity substrate, a passive device formed on the high resistivity substrate, and a control device formed on the high resistivity substrate. The passive device may include a shallow trench device isolation region having a plate shape and formed at a surface portion of the high resistivity substrate, deep trench device isolation regions extending downward from a lower surface of the shallow trench device isolation region so as to define at least one isolated region therebetween, at least one insulating layer formed on the high resistivity substrate, and at least one passive component formed on the insulating layer.

In accordance with some exemplary embodiments, at least one of the RF switching device, the RF active device and the control device may include a transistor formed on the high resistivity substrate and a second deep trench device isolation region formed in the high resistivity substrate to surround the transistor.

In accordance with some exemplary embodiments, the at least one of the RF switching device, the RF active device and the control device may further include a second shallow trench device isolation region formed on the second deep trench device isolation region.

In accordance with some exemplary embodiments, the high resistivity substrate may have a first conductive type, a deep well region having a second conductive type may be formed in the high resistivity substrate, a first well region having the first conductive type may be formed on the deep well region, and the transistor may be formed on the first well region.

In accordance with some exemplary embodiments, the second deep trench device isolation region may be formed deeper than the deep well region.

In accordance with some exemplary embodiments, a second well region having the second conductive type may be formed outside the second deep trench device isolation region, and a second high concentration impurity region having the second conductive type may be formed on the second well region.

In accordance with some exemplary embodiments, the second deep trench device isolation region may have a slit to electrically connect the deep well region with the second well region.

In accordance with some exemplary embodiments, a third device isolation region may be formed to surround the second well region and the second high concentration impurity region.

In accordance with some exemplary embodiments, the third device isolation region may include a third deep trench device isolation region formed to surround the second well region and the second high concentration impurity region and a third shallow trench device isolation region formed on the third deep trench device isolation region.

In accordance with some exemplary embodiments, a third well region having the first conductive type may be formed outside the third device isolation region.

In accordance with some exemplary embodiments, at least one of the RF switching device, the RF active device and the control device may include a plurality of transistors electrically connected with one another so as to have a multi-finger structure.

In accordance with some exemplary embodiments, a high concentration impurity region may be formed between source regions of transistors disposed adjacent with each other among the plurality of transistors, and the high concentration impurity region has a conductive type different from the source regions of the adjacent transistors and electrically connected with the source regions of the adjacent transistors.

In accordance with some exemplary embodiments, at least one of the RF active device and the control device may include a first deep well region having a first conductive type and formed in the high resistivity substrate, a second deep well region having a second conductive type and formed on the first deep well region, a first well region having the first conductive type and formed on the second deep well region, and a transistor formed on the first well region.

In accordance with some exemplary embodiments, the RF switching device may include a deep well region having a second conductive type and formed in the high resistivity substrate, a low concentration well region having a first conductive type and formed on the deep well region, and a transistor formed on the low concentration well region.

In accordance with some exemplary embodiments, the low concentration well region may have an impurity concentration in a range of about 1E+10 to about 1E+12 ions/cm$^2$.

In accordance with some exemplary embodiments, the passive device may further include a noise blocking layer formed on the shallow trench device isolation region. The noise blocking layer may include the same material as gate electrodes or metal wirings of the RF switching device, the RF active device and the control device.

The above summary of the invention is not intended to describe each illustrated embodiment or every implementation of the present invention. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which:

FIG. 8 is a cross-sectional view taken along line VIII-VIII' as shown in FIG. 6.

FIGS. 9 to 12 are cross-sectional views illustrating other examples of the RF switching device as shown in FIGS. 6 to 8;

Figure 1:
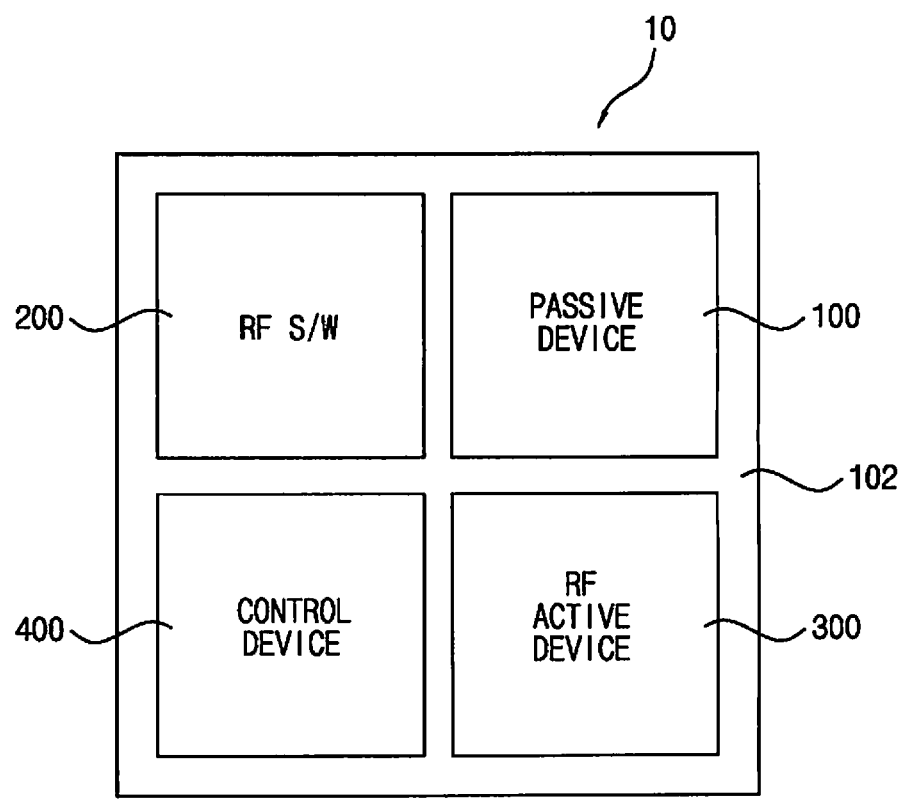
FIG. 1 is a schematic view illustrating a passive device and an RF module including the same in accordance with an exemplary embodiment of the claimed invention.

While embodiments are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF EMBODIMENTS

Hereinafter, specific embodiments will be described in more detail with reference to the accompanying drawings. The claimed invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the claimed invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the claimed invention. Unless otherwise defined herein, all the terms used herein, which include technical or scientific terms, may have the same meaning that is generally understood by those skilled in the art.

The depicted embodiments are described with reference to schematic diagrams of some embodiments of the claimed invention. Accordingly, changes in the shapes of the diagrams, for example, changes in manufacturing techniques and/or allowable errors, are expected. Embodiments of the claimed invention are not described as being limited to specific shapes of areas described with diagrams and include deviations in the shapes. The areas described with drawings likewise are entirely schematic and their shapes do not represent exact shapes, but rather the claimed invention is intended to include components of various other sizes, shapes, and details that would be understood to those of ordinary skill in the art.

Figure 2:
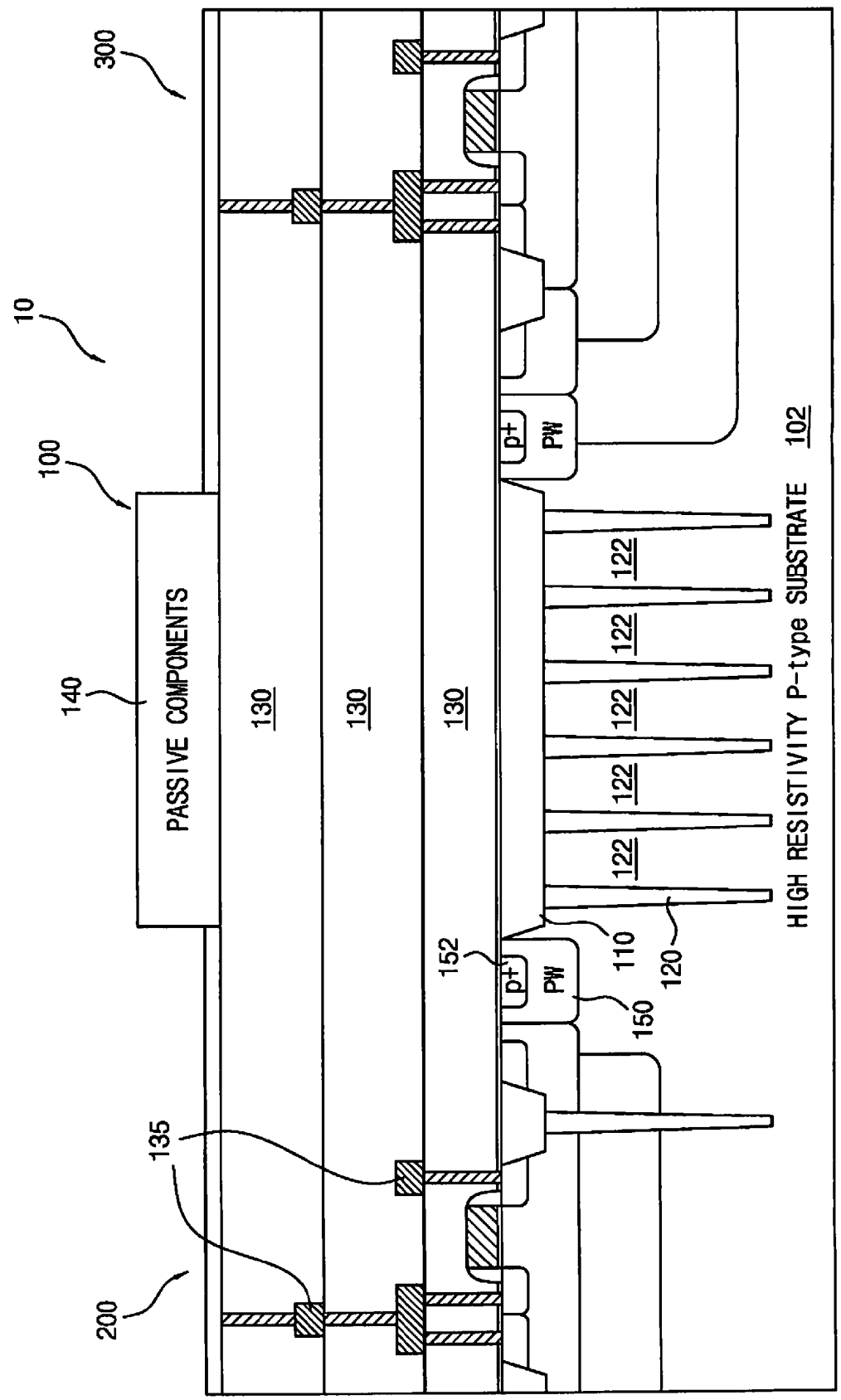
FIG. 2 is a cross-sectional view illustrating the passive device as shown in FIG. 1.
Figure 3:
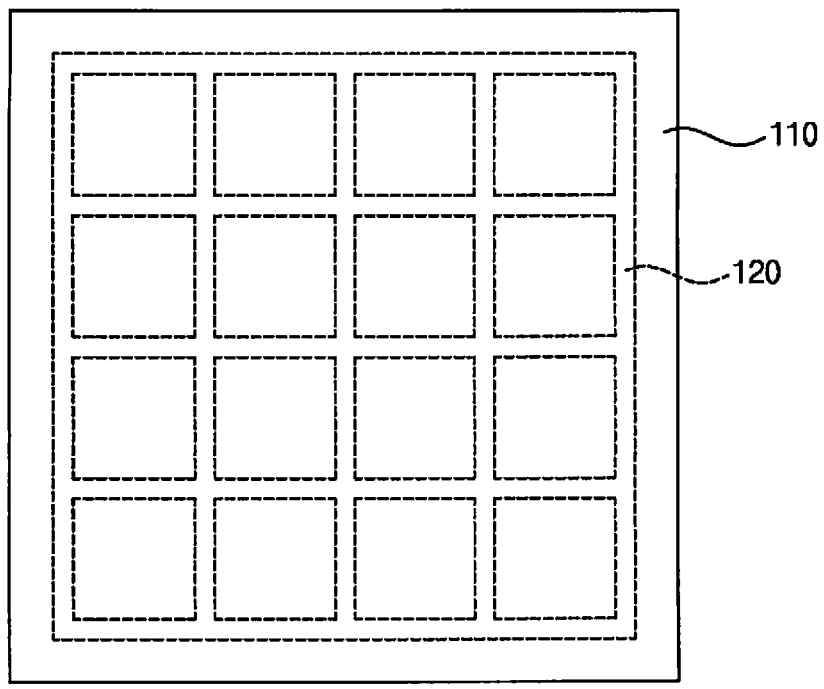
FIG. 3 is a plan view illustrating a shallow trench device isolation region and deep trench device isolation regions as shown in FIG. 2.

FIG. 1 is a schematic view illustrating a passive device and an RF module including the same in accordance with an exemplary embodiment of the claimed invention, FIG. 2 is a cross-sectional view illustrating the passive device as shown in FIG. 1, and FIG. 3 is a plan view illustrating a shallow trench device isolation region and deep trench device isolation regions as shown in FIG. 2.

Referring to FIGS. 1 to 3, a passive device 100, in accordance with an exemplary embodiment of the claimed invention, may be used to manufacture an RF module 10 such as an RF FEM. The RF FEM may be incorporated into various types of wireless devices, including mobile phones, smart phones, notebooks, tablet PCs, PDAs, electronic gaming devices, multi-media systems, and the like.

An RF module 10 may, like the device shown in FIGS. 1-3, include a passive device 100, an RF switching device 200, an RF active device 300 and a control device 400, which may be formed on a high resistivity substrate 102. For example, the RF active device 300 may include a power amplifier.

In accordance with an exemplary embodiment of the claimed invention, the passive device 100 may include a shallow trench device isolation (STI) region 110 having a plate shape and formed at a surface portion of the high resistivity substrate 102, deep trench device isolation (DTI) regions 120 extending downward from a lower surface of the STI region 110 so as to define a plurality of isolated regions 122 therebetween, one or more insulating layers 130 formed on the high resistivity substrate 102, and passive components 140 formed on at least one of the insulating layers 130. For example, in embodiments the passive device 100 may include passive components 140 such as capacitors, inductors, transformers, or the like.

The high resistivity substrate 102 may be formed of silicon (Si) and have a first conductive type, for example, P-type. For example, the high resistivity substrate 102 may be lightly doped with a P-type impurity, for example, boron, indium, or combinations thereof and may have a relatively high resistivity higher than about 100 ohm·cm. Particularly, the high resistivity substrate 102 may have a high resistivity of about 1,000 ohm·cm to about 20,000 ohm·cm.

The STI region 110 may have a rectangular plate shape, and the DTI regions 120 may constitute a plurality of rectangular tubes as shown in FIG. 3. However, the shape of the DTI regions may vary as required, and the scope of the claimed invention is thus not limited by the shape thereof.

The DTI regions 120 may be used to reduce an eddy current inside the high resistivity substrate 102. Further, the effect of the parasitic elements in the high resistivity substrate 102 may be reduced by the DTI regions 120. A depth of the DTI regions 120 may be greater than about 5 μm. For example, a depth of the DTI regions 120 may be in a range of about 5 μm to about 10 μm. Particularly, the quality factor of the inductors may be improved by the STI region 110 and the DTI regions 120, and thus the electrical characteristics of the passive device 100 may be sufficiently improved.

To form the DTI regions 120, deep trenches may be formed by a deep reactive ion etching (DRIE) process and an oxide liner (not shown) may be formed on inner surfaces of the deep trenches by a thermal oxidation process. Then, the deep trenches may be filled up with un-doped polysilicon thereby forming the DTI regions 120. Meanwhile, a shallow trench may be formed at a surface portion of the high resistivity substrate 102 and may then be filled up with silicon oxide thereby forming the STI region 110.

A plurality of insulating layers 130 may be formed on the high resistivity substrate 102, and metal wirings 135, which are connected with the RF switching device 200, the RF active device 300 and the control device 400, may be formed among the insulating layers 130. The passive components 140 may be formed on an uppermost insulating layer among the insulating layers 130.

The passive device 100 may include a guard ring 150 configured to surround the STI region 110. The guard ring 150 may be used to isolate the passive device 100 from the RF switching device 200, the RF active device 300 and the control device 400. For example, a well region having the first conductive type, i.e., a P-type well (PW) region may be used as the guard ring 150, and a P-type high concentration impurity region 152 may be formed on the guard ring 150.

Figure 4:
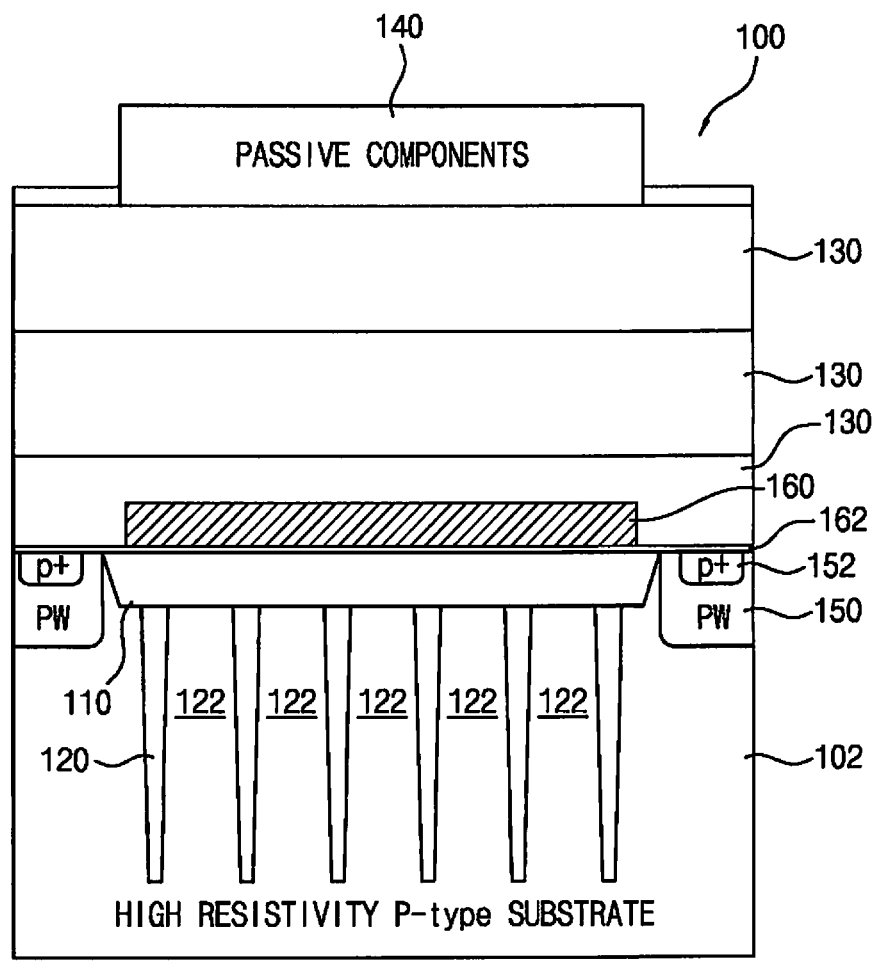
FIG. 4 is a cross-sectional view illustrating a passive device in accordance with another exemplary embodiment of the claimed invention.
Figure 5:
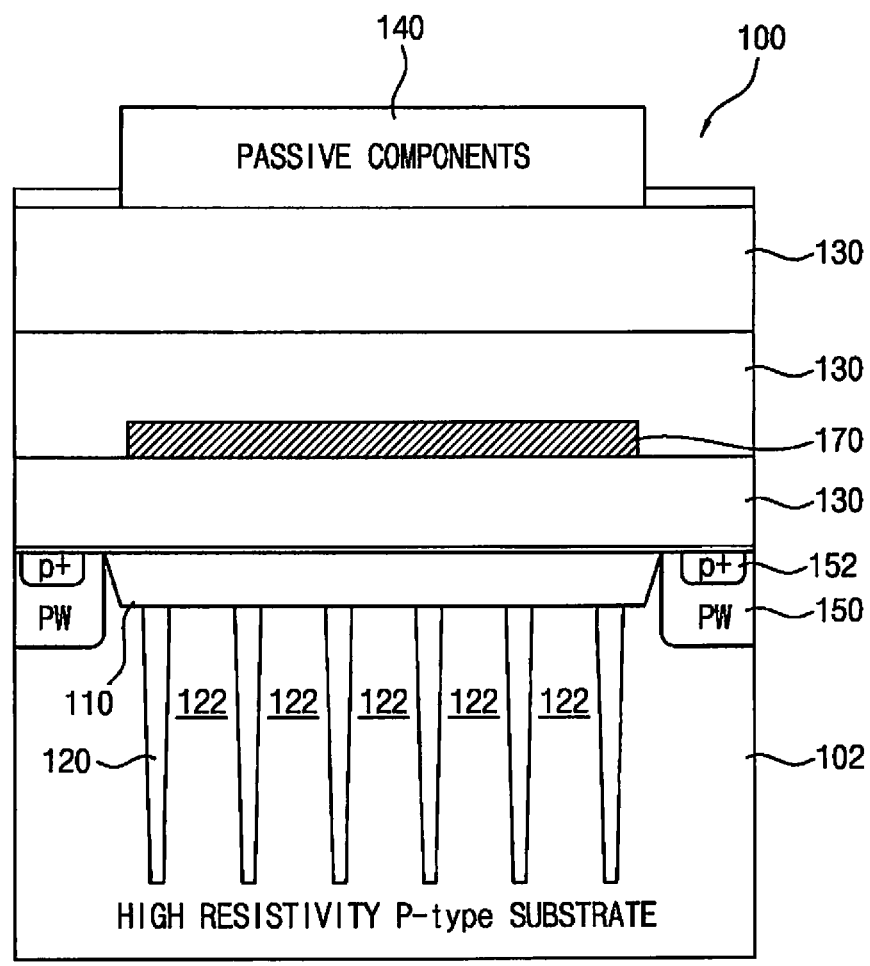
FIG. 5 is a cross-sectional view illustrating a passive device in accordance with still another exemplary embodiment of the claimed invention.

FIG. 4 is a cross-sectional view illustrating a passive device in accordance with another exemplary embodiment of the claimed invention, and FIG. 5 is a cross-sectional view illustrating a passive device in accordance with still another exemplary embodiment of the claimed invention.

Referring to FIG. 4, the passive device 100 may include a noise blocking layer 160 formed on the STI region 110. The noise blocking layer 160 may be used to prevent an RF noise from being transmitted to the passive components 140 from the high resistivity substrate 102.

The noise blocking layer 160 may be formed of a conductive material. For example, the noise blocking layer 160 may be formed of the same material as gate electrodes of the RF switching device 200, the RF active device 300 and the control device 400. Particularly, the noise blocking layer 160 may be formed of doped poly-silicon with impurity.

Meanwhile, an insulating layer 162 may be formed between the noise blocking layer 160 and the STI region 110. The insulating layer 162 may be used as gate insulating layers of the RF switching device 200, the RF active device 300 and the control device 400.

Referring to FIG. 5, the passive device 100 may include a noise blocking layer 170 between the insulating layers 130. For example, the noise blocking layer 170 may be formed of the same material as the metal wirings 135 of the RF switching device 200, the RF active device 300 and the control device 400.

Figure 6:
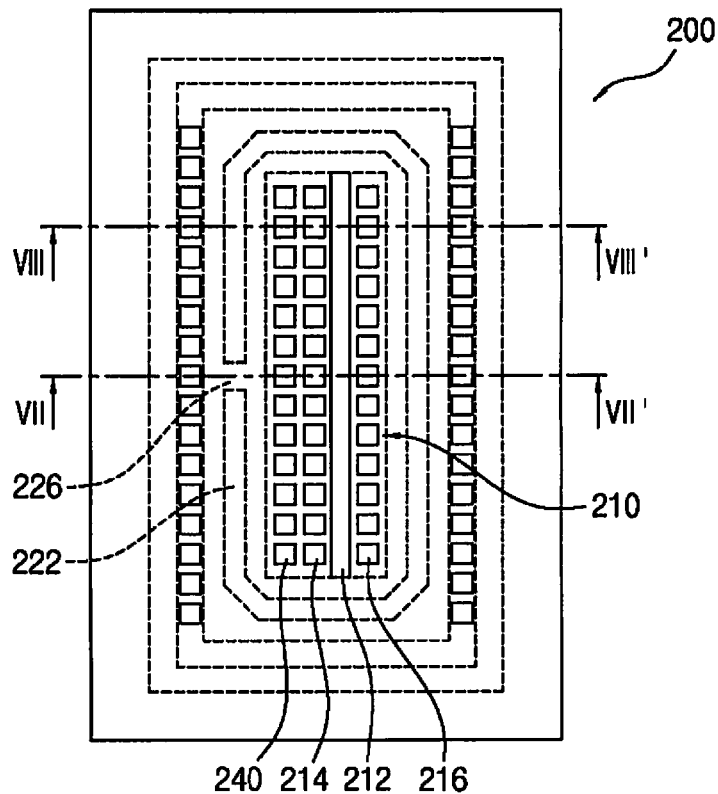
FIG. 6 is a plan view illustrating the RF switching device as shown in FIG. 1.
Figure 7:
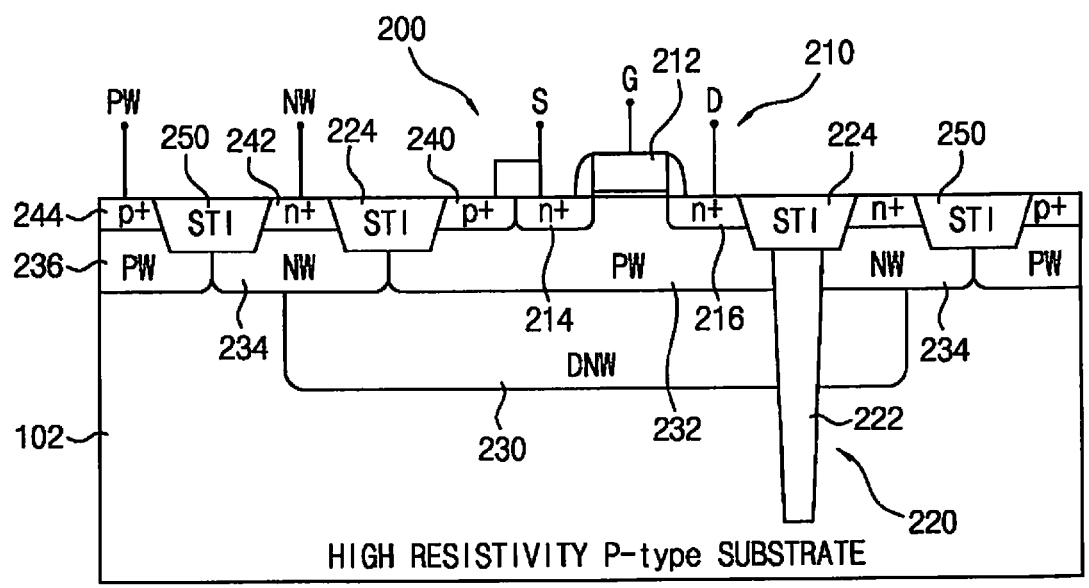
FIG. 7 is a cross-sectional view taken along line VII-VII' as shown in FIG. 6.

FIG. 6 is a plan view illustrating the RF switching device as shown in FIG. 1, FIG. 7 is a cross-sectional view taken along line VII-VII' as shown in FIG. 6, and FIG. 8 is a cross-sectional view taken along line VIII-VIII' as shown in FIG. 6.

Referring to FIGS. 6 to 8, the RF switching device 200 may include a plurality of transistors 210 formed on the high resistivity substrate 102. A deep well region 230 having a second conductive type may be formed in the high resistivity substrate 102, and a first well region 232 having the first conductive type may be formed on the deep well region 230. For example, a deep N-type well (DNW) region 230 may be formed in the high resistivity substrate 102, and a first P-type well (PW) region 232 may be formed on the DNW region 230.

The transistors 210 may be formed on the first PW region 232. Each of the transistors 210 may include a gate structure 212 formed on the first PW region 232 and source and drain regions 214 and 216 formed at surface portions of the first PW region 232 adjacent to both sides of the gate structure 212, respectively. The gate structure 212 may include a gate insulating layer formed on the first PW region 232, a gate electrode formed on the gate insulating layer and a spacer formed on side surfaces of the gate electrode.

The source and drain regions 214 and 216 may be doped with an impurity having the second conductive type, in embodiments. For example, the source and drain regions 214 and 216 may be doped with an N-type impurity such as phosphorus, arsenic, or combinations thereof. A high concentration impurity region 240 having the first conductive type, i.e., P-type, may be formed on one side of the source region 214, which may be used as a substrate tab or a well tab. The high concentration impurity region 240 may be electrically connected with the source region 214.

The RF switching device 200 may include a device isolation region 220 configured to surround an active region on which the transistors 210 are formed. The device isolation region 220 may include a DTI region 222 formed deeper than the DNW region 230 and a STI region 224 formed on the DTI region 222.

The DTI region 222 may be used to reduce an RF noise coupling and improve the electrical characteristics of the passive device 100. A depth of the DTI region 222 may be greater than about 5 μm. For example, a depth of the DTI region 222 may be in a range of about 5 μm to about 10 μm. The DTI region 222 and the STI region 224 of the RF switching device 200 may be formed at the same time as the DTI regions 120 and the STI region 110 of the passive device 100, respectively.

An N-type well (NW) region 234 may be formed outside the device isolation region 220, and an N-type high concentration impurity region 242 may be formed on the NW region 234.

Particularly, the first PW region 232 may be formed inside the device isolation region 220, and the DNW region 230 may be formed wider than the first PW region 232. The DTI region 222 may pass through the DNW region 230 and extend deeper than the DNW region 230. The NW region 234 may be formed on an edge portion of the DNW region 230.

The NW region 234 may be electrically connected with the edge portion of the DNW region 230, and the DTI region 222 may have a slit 226 (See FIG. 6) to electrically connect the DNW region 230 with the NW region 234. The slit 226 may be used to apply an NW bias voltage or a reverse bias voltage to the DNW region 230 through the N-type high concentration impurity region 242 and the NW region 234. For example, a width of the slit 226 may be in a range of about 1 μm to about 2 μm.

Thus, a depletion region between the first PW region 232 and the DNW region 230 and a depletion region between the DNW region 230 and the high resistivity substrate 102 may extend, and a junction capacitance between the first PW region 232 and the DNW region 230 and a junction capacitance between the DNW region 230 and the high resistivity substrate 102 may be sufficiently reduced. As a result, an RF noise coupling of the RF switching device 200 and a leakage current through the high resistivity substrate 102 may be sufficiently reduced.

Further, a second PW region 236 may be formed outside the NW region 234, and a second P-type high concentration impurity region 244 may be formed on the second PW region 236. The second P-type high concentration impurity region 244 may be used to apply a PW bias voltage to the high resistivity substrate 102, and the second PW region 236 may be used to reduce or prevent a depletion region from extending between the NW region 234 and the high resistivity substrate 102. Still further, a second STI region 250 may be formed between the N-type high concentration impurity region 242 and the second P-type high concentration impurity region 244.

In accordance with the present exemplary embodiment, the RF active device 300 and the control device 400 may have substantially the same structure as the RF switching device 200.

FIGS. 9 to 12 are cross-sectional views illustrating other examples of the RF switching device as shown in FIGS. 6 to 8.

Referring to FIG. 9, a low concentration P-type well (LPW) region 238 may be formed on the DNW region 230 in place of the first PW region 232, and the transistors 210 may be formed on the LPW region 238.

Particularly, the LPW region 238 may be used to reduce off-state capacitance (Coff) and on-state resistance (Ron) of the RF switching device 200. In detail, depletion regions between the source and drain regions 214 and 216 and the LPW region 238 may sufficiently extend, and thus the Coff and Ron of the RF switching device 200 may be sufficiently reduced. As a result, the RF switch performance of the RF switching device 200 may be sufficiently improved.

For example, the LPW region 238 may have an impurity concentration in a range of about 1E+10 to about 1E+12 ions/cm$^2$. Alternatively, though not shown in figures, the LPW region 238 may be formed on the first PW region 232. In such case, it is desirable that the LPW region 238 may have an impurity concentration lower than that of the first PW region 232.

Further, the LPW region 238 may be an un-implanted region. That is, a surface portion of the high resistivity substrate 102 may be used as the LPW region 238.

Figure 10:
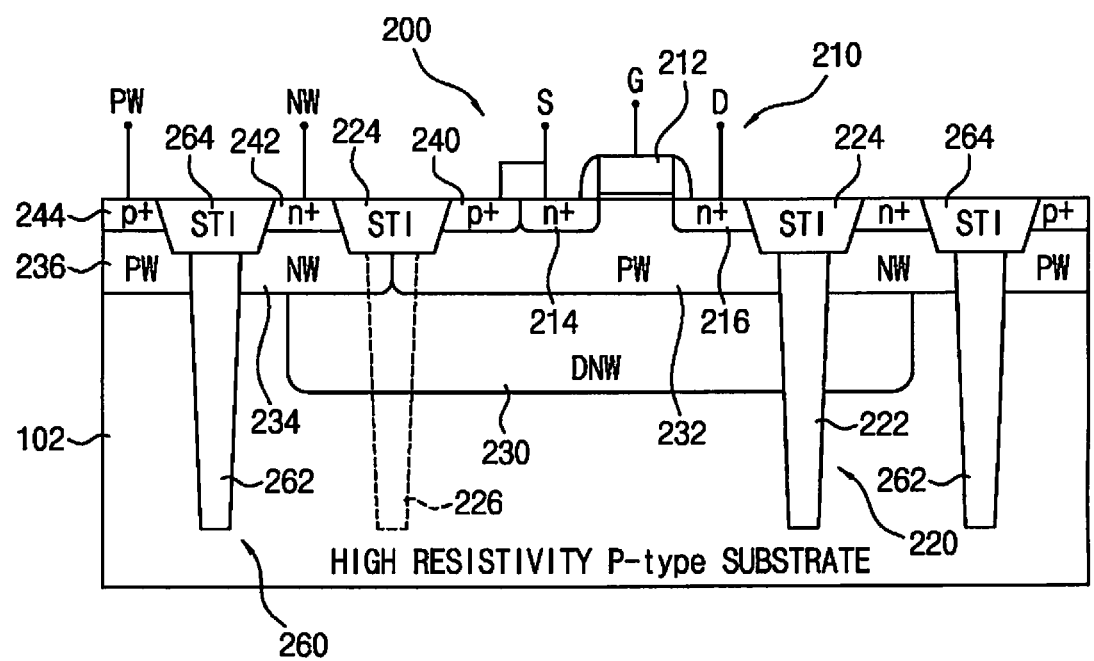
Figure 11:
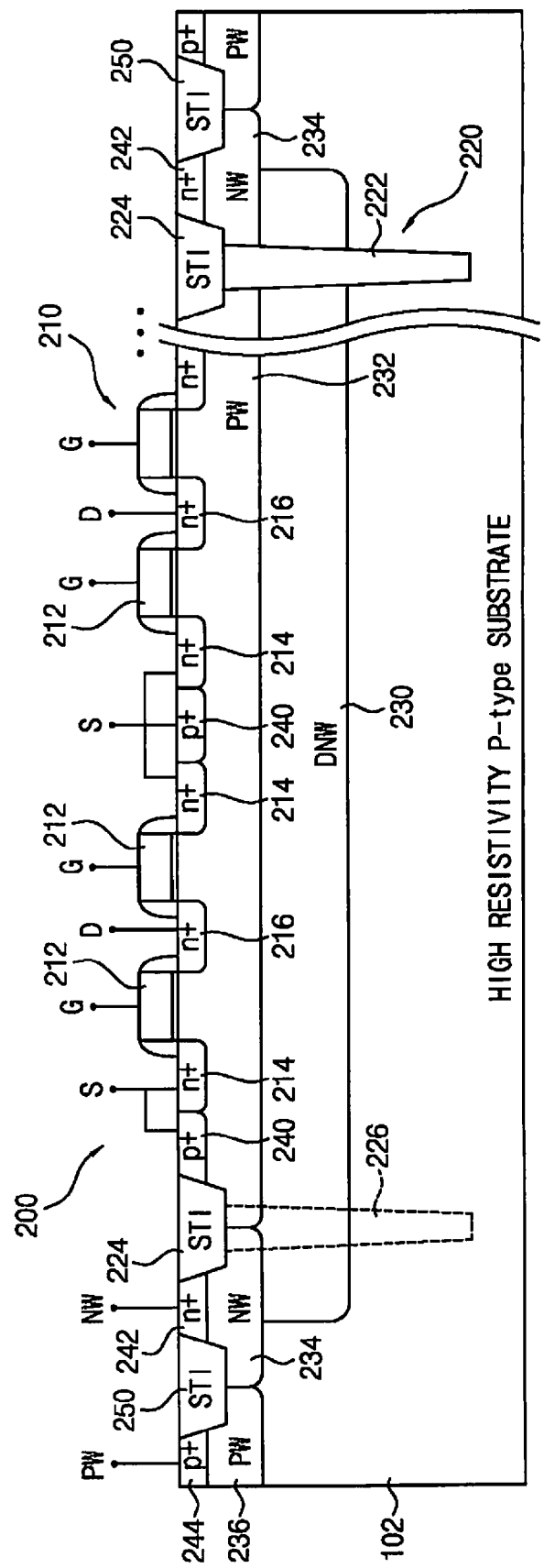

Referring to FIG. 10, the RF switching device 200 may include a second device isolation region 260. The second device isolation region 260 may have a ring shape to surround the NW region 234 and the N-type high concentration impurity region 242. The second device isolation region 260 may include a second DTI region 262 and a second STI region 264 formed on the second DTI region 262.

For example, a depth of the second DTI region 262 may be greater than about 5 μm. Particularly, a depth of the second DTI region 262 may be in a range of about 5 μm to about 10 μm.

The second device isolation region 260 may be used to reduce or prevent a depletion region from extending between the DNW region 230, the NW region 234 and the high resistivity substrate 202. Further, the second device isolation region 260 may be used to electrically isolate the RF switching device 200 from the passive device 100, the RF active device 300 and the control device 400 adjacent thereto.

Referring to FIG. 1, the RF switching device 200 may include a plurality of transistors 210. Particularly, the RF switching device 200 may have a multi-finger structure in which the transistors 210 are electrically connected with one another.

The transistors 210 may be formed on the first PW region 232. Each of the transistors 210 may include a gate structure 212 formed on the first PW region 232 and source and drain regions 214 and 216 formed at surface portions of the first PW region 232 adjacent to both sides of the gate structure 212, respectively.

Particularly, transistors 210 adjacent with each other may use a drain region 216 in common. Further, transistors 210 adjacent with each other may use a P-type high concentration impurity region 240 in common. In detail, a P-type high concentration impurity region 240, which can function as a substrate tab or a well tab, may be formed between the source regions 214 of the transistors 210 adjacent with each other, and the adjacent source regions 214 and the P-type high concentration impurity region 240 may be electrically connected with one another. The P-type high concentration impurity region 240 may be used to improve the breakdown voltage of the transistors 210.

Figure 12:
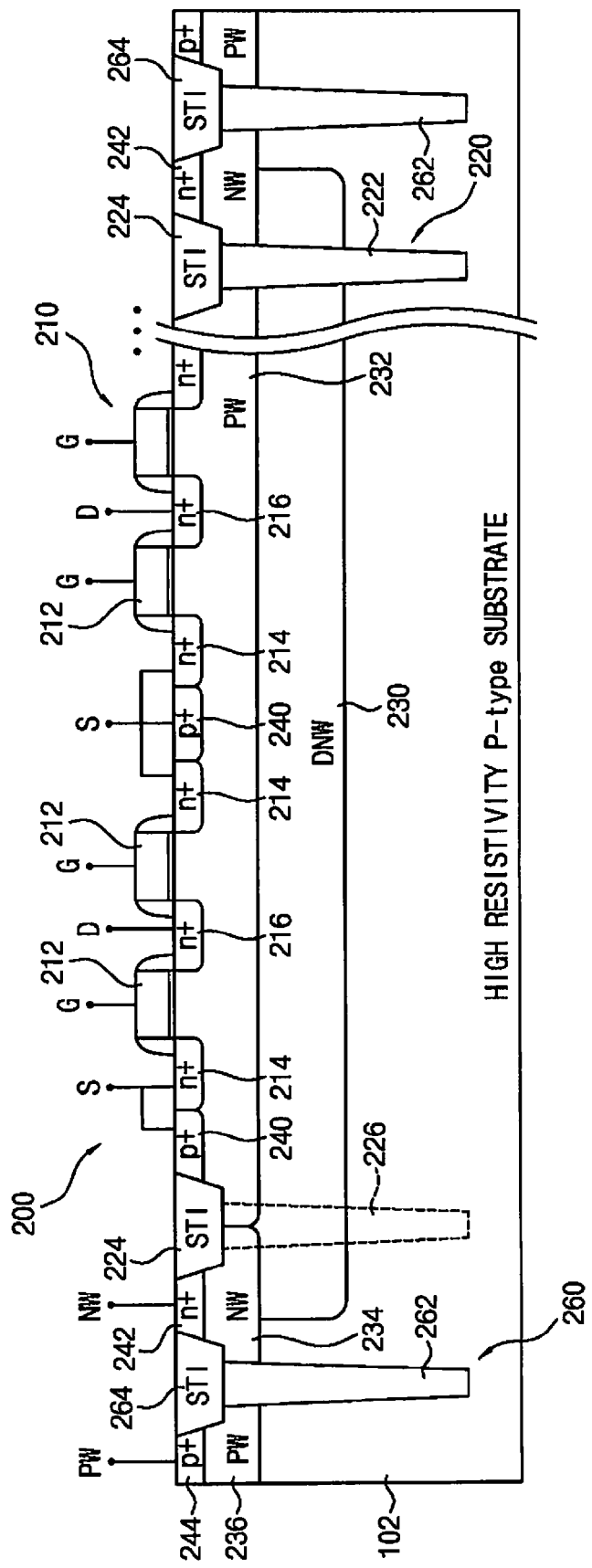

Further, the RF switching device 200 may include a second device isolation region 260 as shown in FIG. 12.

Figure 13:
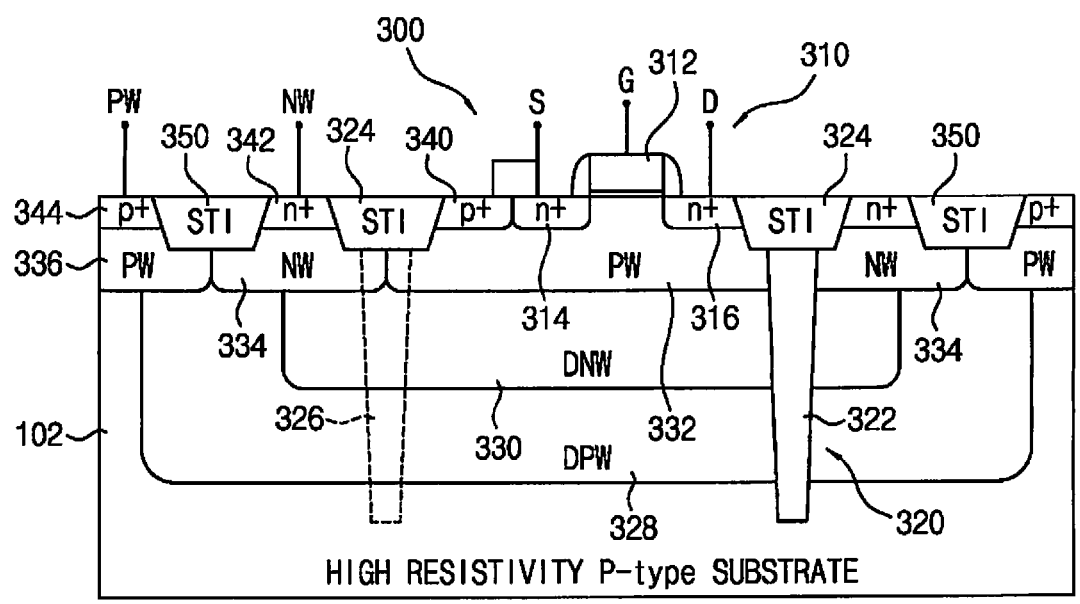
FIG. 13 is a cross-sectional view illustrating the RF active device as shown in FIG. 1.

FIG. 13 is a cross-sectional view illustrating the RF active device as shown in FIG. 1.

Referring to FIG. 13, the RF active device 300 may include a plurality of transistors 310 formed on the high resistivity substrate 102. A deep P-type well (DPW) region 328 may be formed in the high resistivity substrate 102, and a DNW region 330 may be formed on the DPW region 328. Further, a first PW region 332 may be formed on the DNW region 330, and the transistors 310 may be formed on the first PW region 332.

Each of the transistors 310 may include a gate structure 312 formed on the first PW region 332 and source and drain regions 314 and 316 formed at surface portions of the first PW region 332 adjacent to both sides of the gate structure 312, respectively, and a P-type high concentration impurity region 340 may be formed on one side of the source region 314. The gate structure 312 may include a gate insulating layer formed on the first PW region 332, a gate electrode formed on the gate insulating layer and a spacer formed on side surfaces of the gate electrode.

The RF active device 300 may include a device isolation region 320 configured to surround an active region on which the transistors 310 are formed. The device isolation region 320 may include a DTI region 322 formed deeper than the DPW region 328 and a STI region 324 formed on the DTI region 322.

An NW region 334 may be formed outside the device isolation region 320, and an N-type high concentration impurity region 342 may be formed on the NW region 334.

Particularly, the first PW region 332 may be formed inside the device isolation region 320, and the DNW region 330 may be formed wider than the first PW region 332. Further, the DPW region 328 may be formed wider than the DNW region 330. At this time, the DTI region 322 may pass through the DNW region 330 and the DPW region 328 and extend deeper than the DPW region 328. The NW region 334 may be formed on an edge portion of the DNW region 330.

The DTI region 322 may be used to reduce the RF noise coupling and improve the electrical characteristics of the passive device 100. A depth of the DTI region 322 may be greater than about 5 μm. For example, a depth of the DTI region 322 may be in a range of about 5 μm to about 10 μm. The DTI region 322 and the STI region 324 of the RF active device 300 may be formed at the same time as the DTI regions 120 and the STI region 110 of the passive device 100, respectively.

The NW region 334 may be electrically connected with the edge portion of the DNW region 330, and the DTI region 322 may have a slit 326 to electrically connect the DNW region 330 with the NW region 334. The slit 326 may be used to apply an NW bias voltage or a reverse bias voltage to the DNW region 330 through the N-type high concentration impurity region 342 and the NW region 334. For example, a width of the slit 326 may be in a range of about 1 μm to about 2 μm.

Thus, a depletion region between the first PW region 332 and the DNW region 330 and a depletion region between the DNW region 330 and the DPW region 328 may extend, and a junction capacitance between the first PW region 332 and the DNW region 330 and a junction capacitance between the DNW region 330 and the DPW region 328 may be sufficiently reduced. As a result, an RF noise coupling of the RF active device 300 and a leakage current through the high resistivity substrate 102 may be sufficiently reduced.

Further, a second PW region 336 may be formed outside the NW region 334, and a second P-type high concentration impurity region 344 may be formed on the second PW region 336. The second PW region 336 may be electrically connected with the DPW region 328, and the second P-type high concentration impurity region 344 may be used to apply a PW bias voltage to the DPW region 328 through the second PW region 336. Particularly, the PW bias voltage may be fully applied to the DPW region 328 through the slit 326, and thus a leakage current of the RF active device 300 may be sufficiently reduced. Meanwhile, a second STI region 350 may be formed between the N-type high concentration impurity region 342 and the second P-type high concentration impurity region 344.

In accordance with the present exemplary embodiment, the control device 400 may have substantially the same structure as the RF active device 300.

Figure 14:
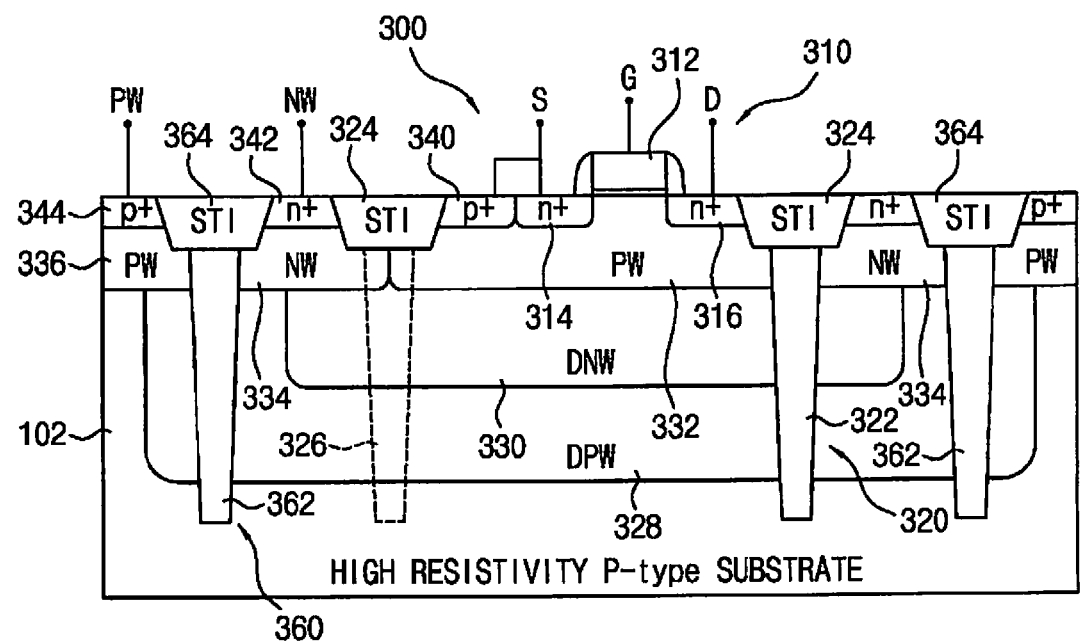
FIGS. 14 to 16 are cross-sectional views illustrating other examples of the RF active device as shown in FIG. 13.
Figure 15:
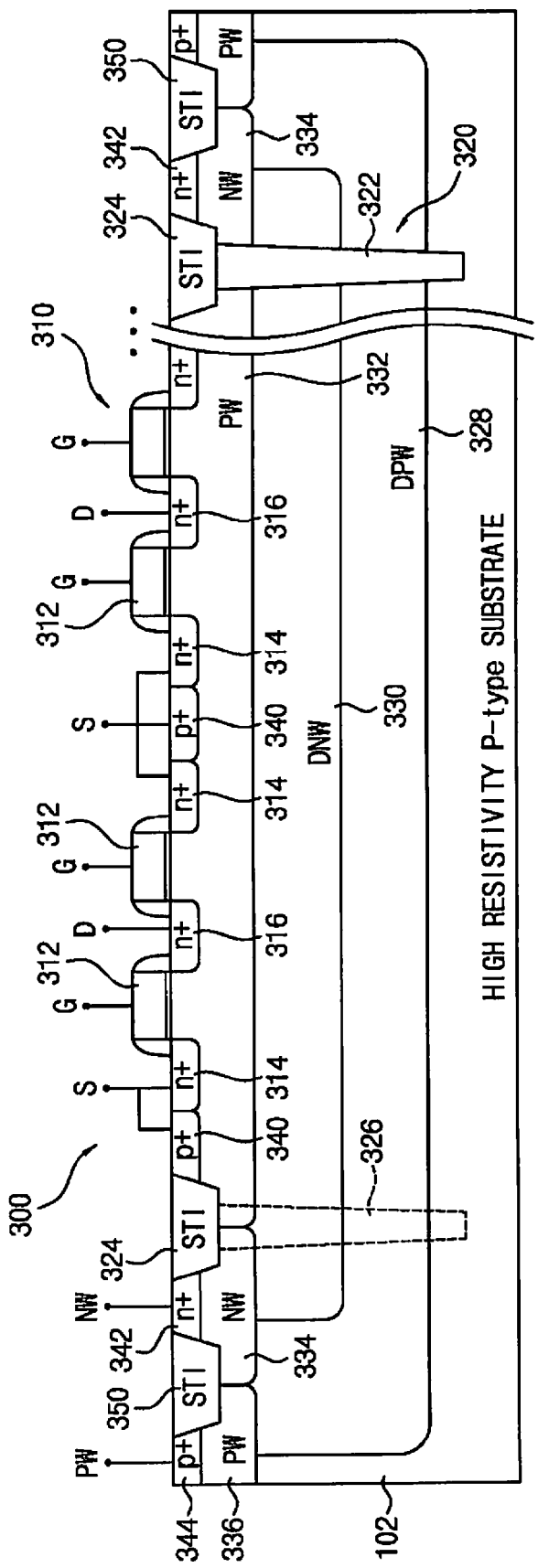
Figure 16:
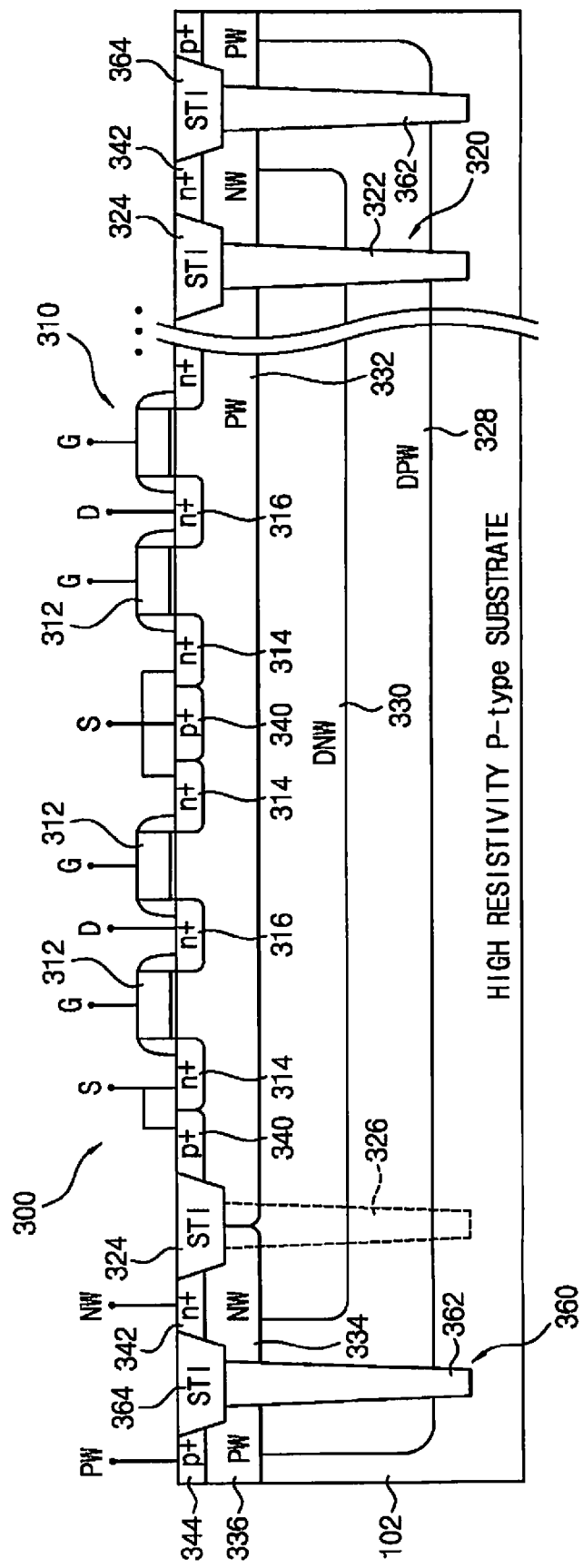

FIGS. 14 to 16 are cross-sectional views illustrating other examples of the RF active device as shown in FIG. 13.

Referring to FIG. 14, the RF active device 300 may include a second device isolation region 360. The second device isolation region 360 may have a ring shape to surround the NW region 334 and the N-type high concentration impurity region 342. The second device isolation region 360 may include a second DTI region 362 and a second STI region 364 formed on the second DTI region 362.

For example, a depth of the second DTI region 362 may be greater than about 5 μm. Particularly, a depth of the second DTI region 362 may be in a range of about 5 μm to about 10 μm.

The second device isolation region 360 may be used to reduce or prevent a depletion region from extending between the DNW region 330, the NW region 334 and the DPW region 328. Further, the second device isolation region 360 may be used to electrically isolate the RF active device 300 from the passive device 100, the RF switching device 200 and the control device 400 adjacent thereto.

Referring to FIG. 15, the RF active device 300 may include a plurality of transistors 310. Particularly, the RF active device 300 may have a multi-finger structure in which the transistors 310 are electrically connected with one another.

The transistors 310 may be formed on the first PW region 332. Each of the transistors 310 may include a gate structure 312 formed on the first PW region 332 and source and drain regions 314 and 316 formed at surface portions of the first PW region 332 adjacent to both sides of the gate structure 312, respectively.

Particularly, transistors 310 adjacent with each other may use a drain region 316 in common. Further, transistors 310 adjacent with each other may use a P-type high concentration impurity region 340 in common. In detail, a P-type high concentration impurity region 340, which functions as a substrate tab or a well tab, may be formed between the source regions 314 of the transistors 310 adjacent with each other, and the adjacent source regions 314 and the P-type high concentration impurity region 340 may be electrically connected with one another. The P-type high concentration impurity region 340 may be used to improve the breakdown voltage of the transistors 310.

Further, the RF active device 300 may include a second device isolation region 360 as shown in FIG. 16.

In accordance with exemplary embodiments of the claimed invention as described above, an RF module may include a high resistivity substrate and an RF switching device, an RF active device, a passive device and a control device formed on the high resistivity substrate. The passive device may include a STI region formed at a surface portion of the high resistivity substrate, DTI regions extending downward from a lower surface of the STI region, an insulating layer formed on the STI region and passive components formed on the insulating layer.

The eddy current and the effect due to the parasitic elements in the high resistivity substrate may be sufficiently reduced by the DTI regions of the passive device. Particularly, Q-factor of the inductors of the passive device may be sufficiently improved. Thus, the electrical characteristics of the passive device may be sufficiently improved by reducing power losses while maintaining oscillatory current flow in a high-resistivity RF system.

Further, as described above, because the RF module may be manufactured by using the high resistivity substrate, the manufacturing cost of the RF module may be sufficiently reduced in comparison with the conventional art using the SOI substrate.

Particularly, each of the RF switching device, the RF active device and the control device may include a deep well region formed in the high resistivity substrate and a DTI region formed deeper than the deep well region, and a reverse bias voltage may be applied to the deep well region. Thus, the junction capacitance, the leakage current and the RF noise coupling of the RF switching device, the RF active device and the control device may be sufficiently reduced.

Although the passive device and the RF module including the same have been described with reference to the specific embodiments, they are not limited thereto. Therefore, it will be readily understood by those skilled in the art that various modifications and changes can be made thereto without departing from the spirit and scope of the appended claims.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

What is claimed is:

1. A passive device comprising:
   a high resistivity substrate having a surface portion;
   a shallow trench device isolation region having a plate shape and formed at the surface portion;
   a plurality of deep trench device isolation regions extending away from a lower surface of the shallow trench device isolation region to define at least one isolated region therebetween;
   at least one insulating layer formed on the high resistivity substrate; and
   at least one passive component formed on the insulating layer.

2. The passive device of claim 1, further comprising:
   a guard ring formed at the surface portion to surround the shallow trench device isolation region.

3. The passive device of claim 1, further comprising:
   a noise blocking layer formed on the shallow trench device isolation region.

4. The passive device of claim 1, wherein a plurality of insulating layers is formed on the high resistivity substrate; and
   a noise blocking layer is formed among the insulating layers.

5. A radio frequency (RF) module comprising:
   an RF switching device formed on a high resistivity substrate;
   an RF active device formed on the high resistivity substrate;
   a passive device formed on the high resistivity substrate; and
   a control device formed on the high resistivity substrate, wherein the passive device comprises:
   a shallow trench device isolation region having a plate shape and formed at a surface portion of the high resistivity substrate;
   a plurality of deep trench device isolation regions extending away from a lower surface of the shallow trench device isolation region so as to define at least one isolated region therebetween;
   at least one insulating layer formed on the high resistivity substrate; and
   at least one passive component formed on the at least one the insulating layer.

6. The RF module of claim 5, wherein at least one of the RF switching device, the RF active device and the control device comprises:
   a transistor formed on the high resistivity substrate; and
   a second deep trench device isolation region formed in the high resistivity substrate to surround the transistor.

7. The RF module of claim 6, wherein the at least one of the RF switching device, the RF active device and the control device further comprises:
   a second shallow trench device isolation region formed on the second deep trench device isolation region.

8. The RF module of claim 6, wherein the high resistivity substrate has a first conductive type;
   a deep well region having a second conductive type is arranged in the high resistivity substrate;
   a first well region having the first conductive type is arranged on the deep well region; and
   the transistor is arranged on the first well region.

9. The RF module of claim 8, wherein the second deep trench device isolation region is formed deeper than the deep well region.

10. The RF module of claim 8, wherein a second well region having the second conductive type is formed outside the second deep trench device isolation region; and a second high concentration impurity region having the second conductive type is formed on the second well region.

11. The RF module of claim 10, wherein the second deep trench device isolation region has a slit to electrically connect the deep well region with the second well region.

12. The RF module of claim 10, wherein a third device isolation region is arranged to surround the second well region and the second high concentration impurity region.

13. The RF module of claim 12, wherein the third device isolation region comprises:

a third deep trench device isolation region arranged to surround the second well region and the second high concentration impurity region; and a third shallow trench device isolation region arranged on the third deep trench device isolation region.

14. The RF module of claim 12, wherein a third well region having the first conductive type is arranged outside the third device isolation region.

15. The RF module of claim 5, wherein at least one of the RF switching device, the RF active device and the control device comprises a plurality of transistors electrically connected with one another to define a multi-finger structure.

16. The RF module of claim 15, wherein a high concentration impurity region is arranged between source regions of transistors disposed adjacent with each other among the plurality of transistors; and the high concentration impurity region has a conductive type different from the source regions of the adjacent transistors and is electrically connected with the source regions of the adjacent transistors.

17. The RF module of claim 5, wherein at least one of the RF active device and the control device comprises:

a first deep well region having a first conductive type and arranged in the high resistivity substrate;

a second deep well region having a second conductive type and arranged on the first deep well region;

a first well region having the first conductive type and arranged on the second deep well region; and a transistor arranged on the first well region.

18. The RF module of claim 5, wherein the RF switching device comprises:

a deep well region having a second conductive type and arranged within the high resistivity substrate;

a low concentration well region having a first conductive type and arranged on the deep well region; and a transistor arranged on the low concentration well region.

19. The RF module of claim 18, wherein the low concentration well region has an impurity concentration in a range of about $1E+10$ to about $1E+12$ ions/cm$^2$.

20. The RF module of claim 5, wherein the passive device further comprises a noise blocking layer formed on the shallow trench device isolation region and made of the same material as gate electrodes or metal wirings of the RF switching device, the RF active device and the control device.

* * * * *